(12) United States Patent
Meloling et al.

(10) Patent No.: US 6,784,670 B1
(45) Date of Patent: Aug. 31, 2004

(54) DUAL CHAMBERED ANECHOIC CHAMBER

(75) Inventors: John Harold Meloling, San Diego, CA (US); David Earl Hurdsman, La Mesa, CA (US); Wendy Marie Massey, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 35 days.

(21) Appl. No.: 10/227,636

(22) Filed: Aug. 21, 2002

(51) Int. Cl.[7] .......................... G01R 27/28; G01R 1/00
(52) U.S. Cl. ................ 324/627; 324/637; 343/703
(58) Field of Search ................ 324/627, 629, 324/631, 637; 343/703, 786

(56) References Cited

U.S. PATENT DOCUMENTS

| | | | |
|---|---|---|---|
| 5,237,283 A | * | 8/1993 | Carbonini .................. 324/627 |
| 5,757,194 A | * | 5/1998 | Yun .......................... 324/627 |
| 5,910,729 A | * | 6/1999 | Yun .......................... 324/627 |
| 6,114,860 A | * | 9/2000 | Yun .......................... 324/637 |
| 6,295,032 B1 | * | 9/2001 | Podgorski .................. 343/703 |
| 6,437,748 B1 | * | 8/2002 | Burnside et al. ............ 343/703 |

* cited by examiner

Primary Examiner—Vincent Q. Nguyen
(74) Attorney, Agent, or Firm—Celia C. Dunham; Michael A. Kagan; Peter A. Lipovsky

(57) ABSTRACT

A dual-chambered anechoic chamber used in conjunction with spatial averaging for making transmission measurements of electromagnetic devices. The anechoic chamber includes a first tapered chamber with a first aperture, a second tapered chamber with a second aperture opposed to the first aperture, an alignment apparatus for aligning the two chambers and, if necessary, for positioning a test device between the apertures, and a positioning mechanism for mounting and determining the position of a transmitter antenna. A receiver antenna in the second chamber receives test signals transmitted from the transmitter antenna. At selected transmitter antenna positions, measurements are taken at different frequencies. For each transmitter position, a measurement is made with the test device positioned between the apertures, and another without the test device. When all desired measurements have been made, the measurement data are spatially averaged; i.e., the measurements are scaled, summed, and averaged, providing a more accurate transmission measurement.

5 Claims, 4 Drawing Sheets

DUAL CHAMBERED ANECHOIC CHAMBER

BACKGROUND OF THE INVENTION

This invention relates generally to the field of anechoic chambers. More specifically, this invention relates to a dual-chambered anechoic chamber used in conjunction with spatial averaging for making transmission measurements of electromagnetic devices.

Large anechoic chambers are used to perform transmission measurements. Building space requirements contribute to the high construction costs of these large chambers, limiting their availability. Box anechoic chambers, which are limited by the box shape and the shape of the aperture, are a less expensive alternative to the large chambers. Enlarging the chamber and thickening the absorber material can achieve increased performance of box chambers, but cost remains a factor.

Thus, there is a need for a relatively small anechoic chamber, which provides accurate transmission measurements without the high costs associated with larger anechoic chambers.

SUMMARY OF THE INVENTION

The invention is a dual-chambered anechoic chamber for making transmission measurements of electromagnetic devices. RF transmission characteristics measured include frequency and time responses. Electromagnetic devices, which may be measured using the anechoic chamber of this invention, include any device with a planar structure.

The anechoic chamber includes two tapered chambers: a first chamber with a first aperture and a second chamber with a second aperture opposed to the first aperture. An alignment apparatus aligns the two chambers and positions a test device between the first and second apertures. A transmitter antenna in the first chamber transmits a test signal, which is received by a receiver antenna in the second chamber. Coupled to the first chamber, the anechoic chamber has a positioning mechanism that includes a support means for mounting the transmitter antenna and a control means for changing the position of the transmitter antenna. In a preferred embodiment, the support means includes an extender bar and the control means includes a sliding mechanism and a stepper motor. The extender bar, on which the transmitter antenna is mounted, keeps the sliding mechanism and motor out of the measurement field. The sliding mechanism and stepper motor control the movements of the transmitter antenna in the first chamber.

RF energy returning from nearby reflectors interferes with measurement accuracy. Anechoic chambers eliminate such reflections. When using the dual-chambered anechoic chamber for making measurements, spatial averaging may be used to provide more accurate transmission measurements. At each selected test frequency, measurement data are recorded a predetermined number of times at different transmitter antenna positions. For each transmitter antenna position, two measurements are made: one measurement with the test device positioned between the first and second apertures, and another measurement without the test device. Finally, when all desired transmission measurements have been completed, the measurement data are spatially averaged; i.e., (a) for each transmitter antenna position, the two measurements are scaled by dividing the measurement with the test device by the measurement without the test device; (b) the scaled measurements for the different antenna positions are summed; and (c) the summed values are averaged by the number of antenna positions used. Thus, at the selected test frequencies, each spatially averaged measurement corresponds to several measurements that have been scaled, summed, and averaged, providing a more accurate transmission measurement.

BRIEF DESCRIPTION OF THE DRAWINGS

For a more complete understanding of this invention, reference is now made to the following detailed description of the embodiments as illustrated in the accompanying drawings wherein.

DESCRIPTION OF THE PREFERRED EMBODIMENT

Figure 1:
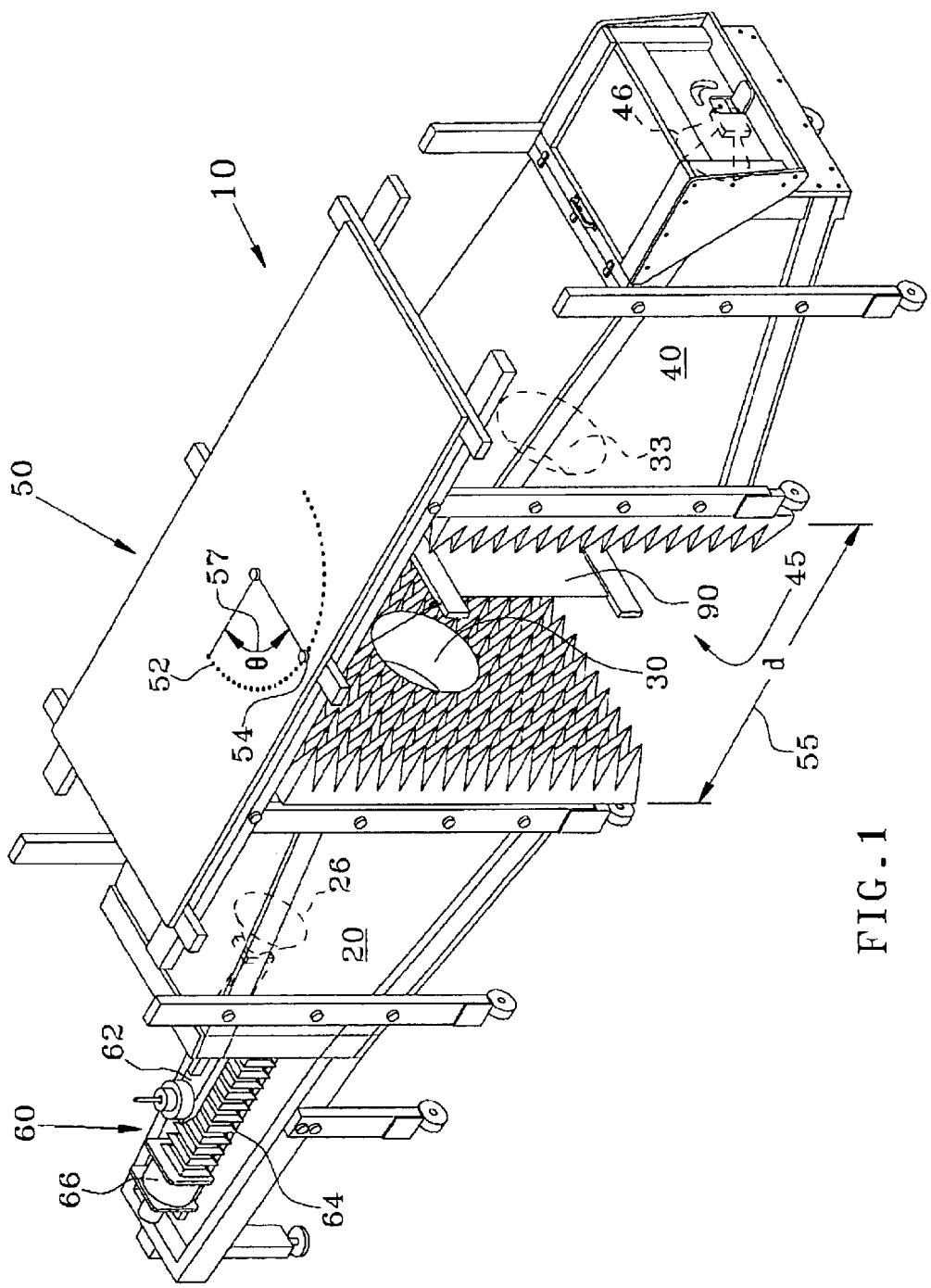
FIG. 1 is an isometric view of a dual-chambered anechoic chamber of the invention.

Referring to the isometric view of FIG. 1, a dual-chambered anechoic chamber 10 is shown. The anechoic chamber 10 comprises two separate and distinct chambers: a first tapered chamber 20 with a first aperture 30, a second tapered chamber 40 with a second aperture 33 (hidden) opposed to the first aperture 30. Anechoic chamber 10 further comprises an unenclosed testing region 45 located outside of the chambers and in between the apertures and an alignment apparatus 50 for aligning the two chambers (20, 40) and for proper positioning of a test device 90, the device under test, between the first aperture 30 and second aperture 33. The alignment apparatus 50 operates to adjust the separation distance 55 between the two tapered chambers (20, 40), thus allowing unenclosed testing region 45 to be varied in area size. In addition, the alignment apparatus 50 is also used to control the incidence angle 57 of the test device 90. The incidence angle 57 is adjusted by selecting the appropriate alignment hole 52 for placement of bolt 54 on top of the alignment apparatus 50.

Still referring to FIG. 1, a transmitter antenna 26 (hidden) in the first chamber 20 transmits a test signal that is received by a receiver antenna 46 (hidden) in the second chamber 40. The anechoic chamber 10 has a positioning mechanism 60 that includes a support means 62 for mounting the transmitter antenna 26 and a control means (64, 66) for changing the position of the transmitter antenna 26.

Figure 2:
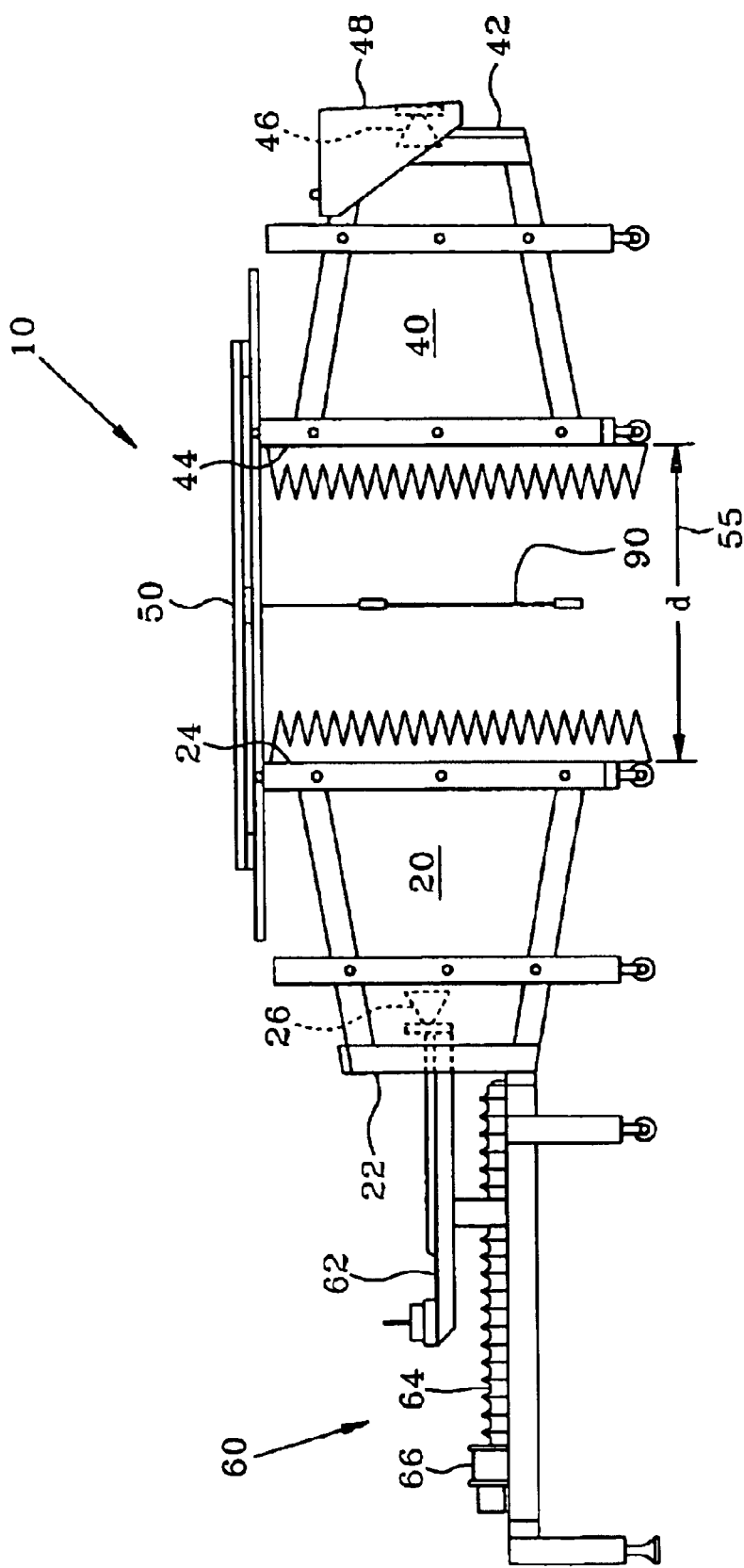
FIG. 2 is a side view of the chamber of FIG. 1.

FIG. 2 shows a side view of the two tapered chambers (20, 40), each with a first end (22, 42) and a larger second end (24, 44). The first end 22 of the first chamber 20 is open. The positioning mechanism 60 is coupled to the open first end 22 of the first chamber 20. The first end 42 of the second chamber 40 has an access door 48 for mounting and accessing the receiver antenna 46 (hidden). Each of the second ends (24, 44) has first and second apertures (not shown) substantially in the center of each end, which allow the signal to pass between the transmitter 26 and receiver 46 antennas (hidden). As shown in FIGS. 1–4, first chamber 20 and second chamber 40 are partially enclosed structures. A feature of the preferred embodiment allows the size and shape of the apertures to be varied to accommodate different types of measurements. The inner walls of both chambers are lined with any suitable radar absorbing material (RAM).

Figure 3:
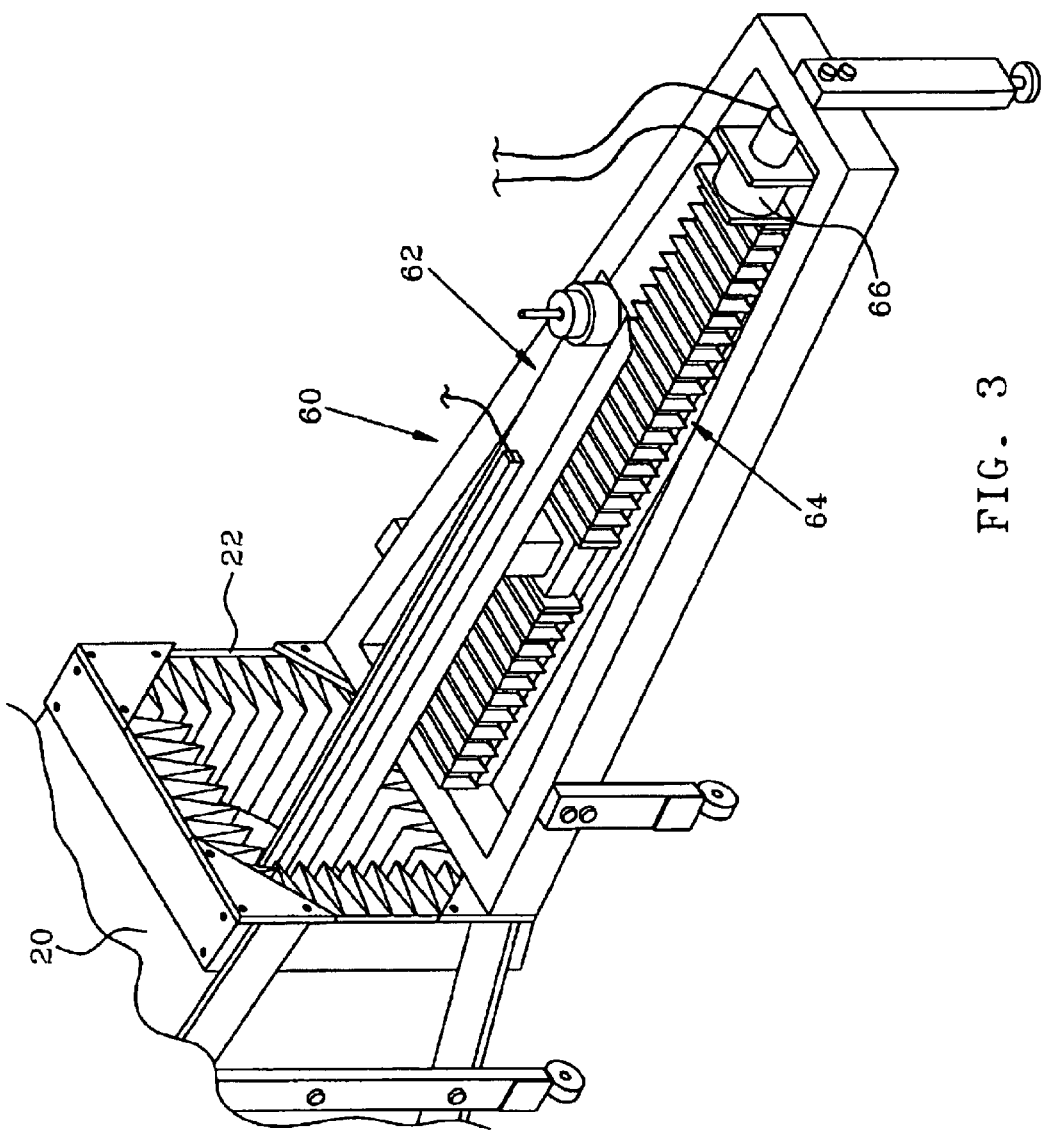
FIG. 3 is an illustration of the positioning mechanism of the chamber of FIG. 1.

FIG. 3 illustrates the invention's positioning mechanism 60, which is coupled to the open first end 22 of the first chamber 20. The positioning mechanism 60 includes a support means 62 for mounting the transmitter antenna (not shown) and a control means (64, 66) for changing the position of the transmitter antenna. In a preferred embodiment, the support means includes an extender bar 62, which extends through the open first end 22 of first chamber 20, and the control means includes a sliding mechanism 64 and a stepper motor 66. The extender bar 62, on which the transmitter antenna is mounted, keeps the sliding mechanism 64 and stepper motor 66 out of the measurement field. The sliding mechanism 64 and stepper motor 66 allow movement of the transmitter antenna in the first chamber 20, thereby varying the distance between the transmitter and receiver antennas.

Figure 4:
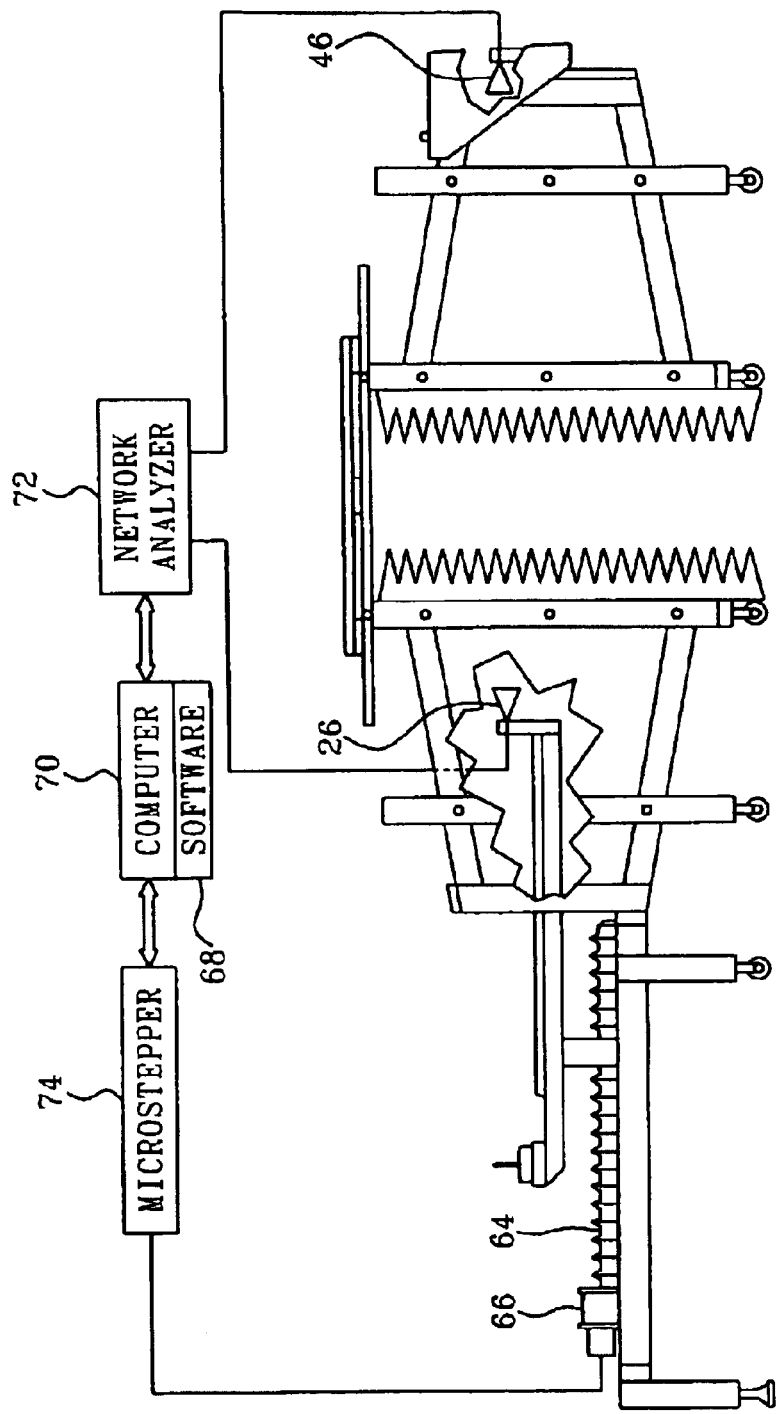
FIG. 4 is an illustration of a general measurement setup using the chamber of FIG. 1.

FIG. 4 illustrates the general measurement setup for using the invention. The measurement process is controlled using a data acquisition software package 68, such as LabView, on a computer 70 that is coupled to a network analyzer 72, such as the HP 8510C Network Analyzer, and a microstepper 74 for controlling the stepper motor 66. Several steps are required for accurate movement of the sliding mechanism 64. The LabView software 68 sends movement commands containing the direction and distance to the computer 70, which then relays the command to the microstepper 74, and which then sends the final command to the stepper motor 66.

When using the dual-chambered anechoic chamber for making transmission measurements, spatial averaging may be used to improve the accuracy of the measurements. At each selected transmitter antenna position, measurements are taken a predetermined number of times at different frequencies. For each transmitter antenna position, two measurements are made in no particular order: one measurement with the test device positioned between the first and second apertures, and a second measurement without the test device. When all desired transmission measurements have been made at the desired transmitter antenna positions at the selected frequencies, the measurement data are spatially averaged; i.e., (a) for each transmitter antenna position, the two measurements are scaled by dividing the measurement with the test device by the measurement without the test device; (b) the scaled measurements for the different antenna positions are summed; and (c) the summed values are averaged by the number of antenna positions used. Thus, at the selected frequencies, each spatially averaged measurement corresponds to the measurements taken at the different antenna positions and which have been scaled, summed, and averaged, providing a more accurate transmission measurement.

We claim:

1. An anechoic chamber for making transmission measurements of electromagnetic devices comprising:
   a tapered first chamber having first and second ends the first end being open and the second end having a first aperture;
   a tapered second chamber having first and second ends, the second end having a second aperture, wherein the second chamber is separated from the first chamber by an adjustable separation distance d such that the first and second apertures are opposed;
   an unenclosed testing region located outside of the first and second chambers and in between the first and second agertures, the testing region having an adjustable area controlled by the separation distance d between the first and second chambers;
   an alignment apparatus coupled to the first and second chambers for controlling the separation distance d between the chambers, for controlling the size of the area of the testing region, and for positioning the electromagnetic device between the apertures;
   a transmitter antenna disposed within the first chamber for transmitting a test signal;
   a positioning mechanism connected to the exterior of the first end of the first chamber for varying the position of the transmitter antenna along a line orthogonal to the plane defined by the first end of the first chamber; and
   a receiver antenna disposed within the second chamber for receiving the test signal.

2. The anechoic chamber of claim 1 wherein the positioning mechanism comprises:
   a support means extending through the open first end of the first chamber for mounting the transmitter antenna; and
   a control means coupled to the support means for changing the position of the transmitter antenna, thereby varying the distance between the transmitter antenna and the receiver antenna.

3. The anechoic chamber of claim 2 wherein the control means includes a sliding mechanism and a stepper motor.

4. The anechoic chamber of claim 3 wherein the first and second apertures are substantially centered in the second ends of each chamber.

5. The anechoic chamber of claim 1 wherein the first and second apertures are variable in size and shape.

* * * * *